(12) United States Patent
Ahsan et al.

(10) Patent No.: US 7,515,502 B1
(45) Date of Patent: Apr. 7, 2009

(54) MEMORY ARRAY PERIPHERAL STRUCTURES AND USE

(75) Inventors: Ishtiaq Ahsan, Wallkill, NY (US); Louis Lu-Chen Hsu, Fishkill, NY (US); Xu Ouyang, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 1 day.

(21) Appl. No.: 11/856,964

(22) Filed: Sep. 18, 2007

(51) Int. Cl.
*G11C 8/00* (2006.01)

(52) U.S. Cl. ............... 365/230.03; 365/210; 365/225.7; 365/63

(58) Field of Classification Search ............ 365/230.03, 365/210, 225.7, 63
See application file for complete search history.

(56) References Cited

U.S. PATENT DOCUMENTS 5,532,963 A * 7/1996 Kushiyama et al. ......... 365/201

* cited by examiner

*Primary Examiner*—Huan Hoang
(74) *Attorney, Agent, or Firm*—Schmeiser, Olsen & Watts; Rosa Yaghmour

(57) ABSTRACT

A method for using photolithographic dummy memory cells arranged in rings around a set of primary memory cells as test structures and as redundant memory cells. Also circuits and structures of memory arrays having multiple-use dummy memory cells.

3 Claims, 10 Drawing Sheets

MEMORY ARRAY PERIPHERAL STRUCTURES AND USE

FIELD OF THE INVENTION

The present invention relates to the field of integrated circuits; more specifically, it relates to an integrated circuit memory array, a circuit and physical structure for the memory array and a method of testing the memory array.

BACKGROUND OF THE INVENTION

The use of photolithographic printing aids in integrated circuit fabrication is well known. Specifically, dummy cells are widely used as an important photolithographic printing aid in memory arrays: a typical memory array is divided into many small blocks and each small block is surrounded by periphery circuits such as sense amplifiers, drivers, and decoders (the size of the block is dependent on memory speed and other design considerations). In order to help the edge cells in each small block to print properly, dummy cells are placed right next to the edge cells. However, these dummy cells consume large amounts of chip real estate and the integrated circuit chip sizes must be increased. Larger chips mean fewer chips per wafer and thus higher costs of manufacture per chip. Therefore, the semiconductor industry is always looking to techniques to reduce integrated circuit chip size without compromising yield and reliability.

SUMMARY OF THE INVENTION

A first aspect of the present invention is a method comprising: fabricating a memory array comprising one or more memory blocks, each memory block of the one or more memory blocks comprising memory cells arranged in rows and columns; for each memory block of the one or more memory blocks, designating memory cells in one or more adjacent rings of memory cells nearest a perimeter of the memory block as dummy memory cells; selecting a set of one to all of the one or more memory blocks to create a set of selected memory blocks; for each memory block of the set of selected memory blocks and before a final fabrication level of the memory array, electrically connecting dummy memory cells of selected rows together, electrically connecting dummy memory cells of selected columns together or both electrically connecting dummy memory cells of selected rows together and electrically connecting dummy memory cells of selected columns together; for each memory block of the of the set of selected memory blocks and before the final fabrication level, testing the selected rows, selected columns or selected rows and columns of dummy memory cells of the; and for each memory block of the of the set of selected memory blocks and after the testing, completing fabrication of the memory block to the final fabrication level.

A second aspect of the present invention is a method comprising: fabricating a memory array comprising an array of one or more memory blocks, each memory block of the one or more memory blocks comprising an array of memory cells arranged in rows and columns; for each memory block of the one or more memory blocks, designating memory cells in one or more adjacent rings of memory cells nearest a perimeter of the memory block as dummy memory cells; selecting a set of one to all of the one or more memory blocks to create a set of selected memory blocks; for each memory block of the one or more memory blocks, except for dummy memory cells, electrically connecting each memory cell in each row to a respective wordline and each wordline to a respective wordline driver; for each memory block of the one or more memory blocks, except for dummy memory cells, electrically connecting each memory cell in each column to a respective bitline and each bitline to a respective bitline decoder; for each memory block of the set of selected memory blocks, electrically connecting a selected row or column of the dummy memory cells together and to selected pads of the memory array; applying a voltage at a first level to the selected pads; for each memory block of the one or more memory blocks, selecting a wordline or bitline that is adjacent to the selected row or column and applying a voltage at a second level to the selected wordline or bitline, the first level different from the second level; and for each memory block of the set of selected memory blocks, measuring any current flow between the selected pads and the selected wordline or bitline.

A third aspect of the present invention is a memory array comprising: an array of one or more memory blocks, each memory block comprising an array of memory cells arranged in rows and columns, memory cells in one or more adjacent rings of memory cells nearest a perimeter of each memory block of the one or more memory blocks designated as dummy memory cells; for at least one of the one or more memory blocks, dummy memory cells in a row or column electrically connected together into a dummy row or dummy column, a first end of the dummy row or dummy column connected to a first pad of the memory array; for each memory block of the one or more memory blocks, except for dummy memory cells, memory cells in each row connected to a respective wordline and each wordline connected to a respective wordline driver; and for each memory block of the one or more memory blocks, except for dummy memory cells, memory cells in each column of the memory array connected to a respective bitline and each bitline connected to a respective bitline decoder.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 1:
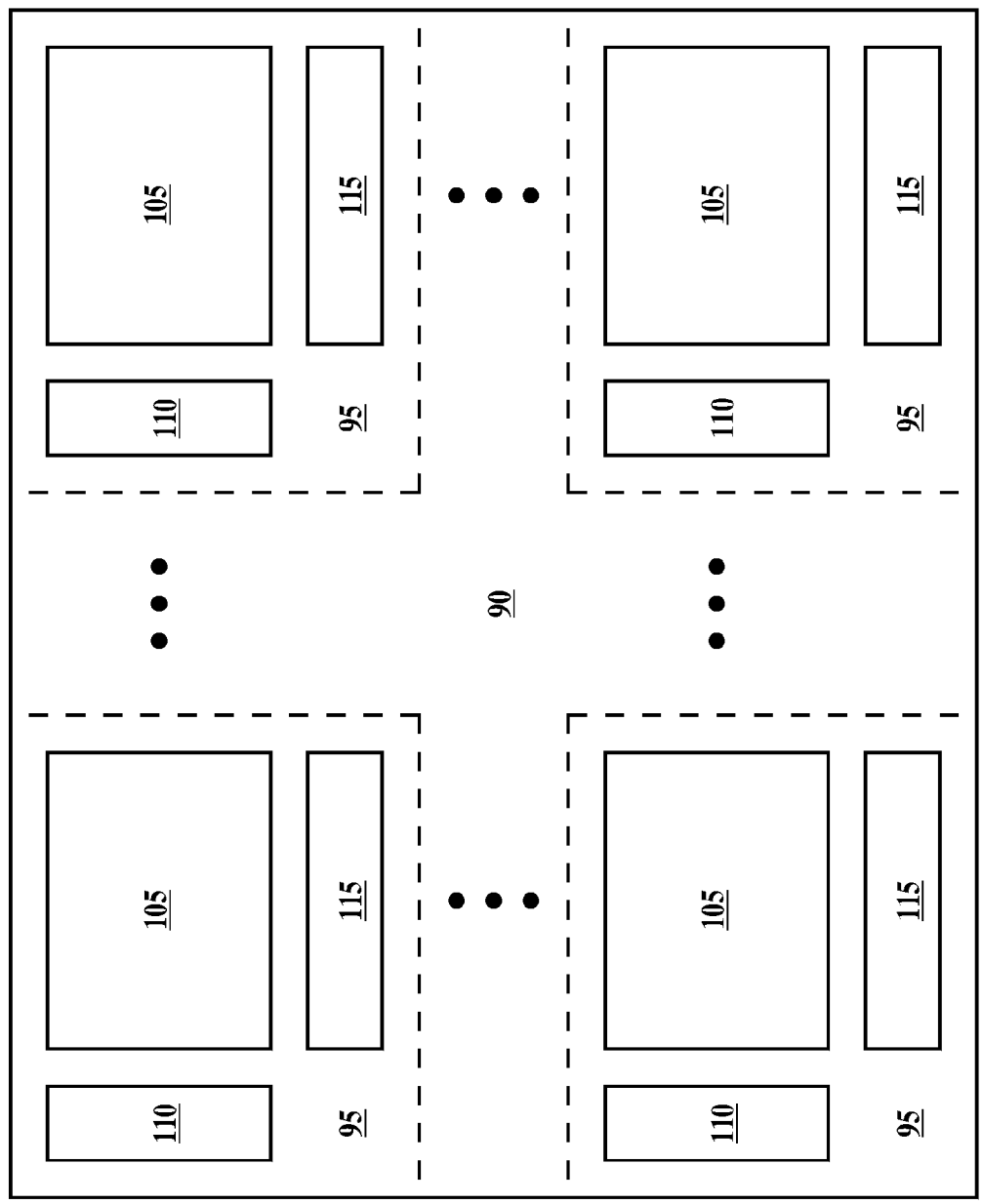
FIG. 1 is a schematic diagram of an exemplary memory array to be modified according to the embodiments of the present invention.

FIG. 1 is a schematic diagram of an exemplary memory array to be modified according to the embodiments of the present invention. In FIG. 1, a memory array 90 includes an array of memory blocks 95 in rows and columns. Each memory block 95 includes a memory cell array 105, a local wordline driver circuit 110 and a local bitline decode circuit 115. Wordline driver circuit 10 and bitline decode circuits 115 are examples of local support circuits. In one example, all memory blocks 95 are identical. In one example, memory blocks 95 are similar but may differ in size (i.e., the number of memory cells in memory cell arrays 105 and supporting circuits) or geometric layout. In one example, there is only one memory block in memory array 90 in which case the memory block is the memory array.

Figure 2:
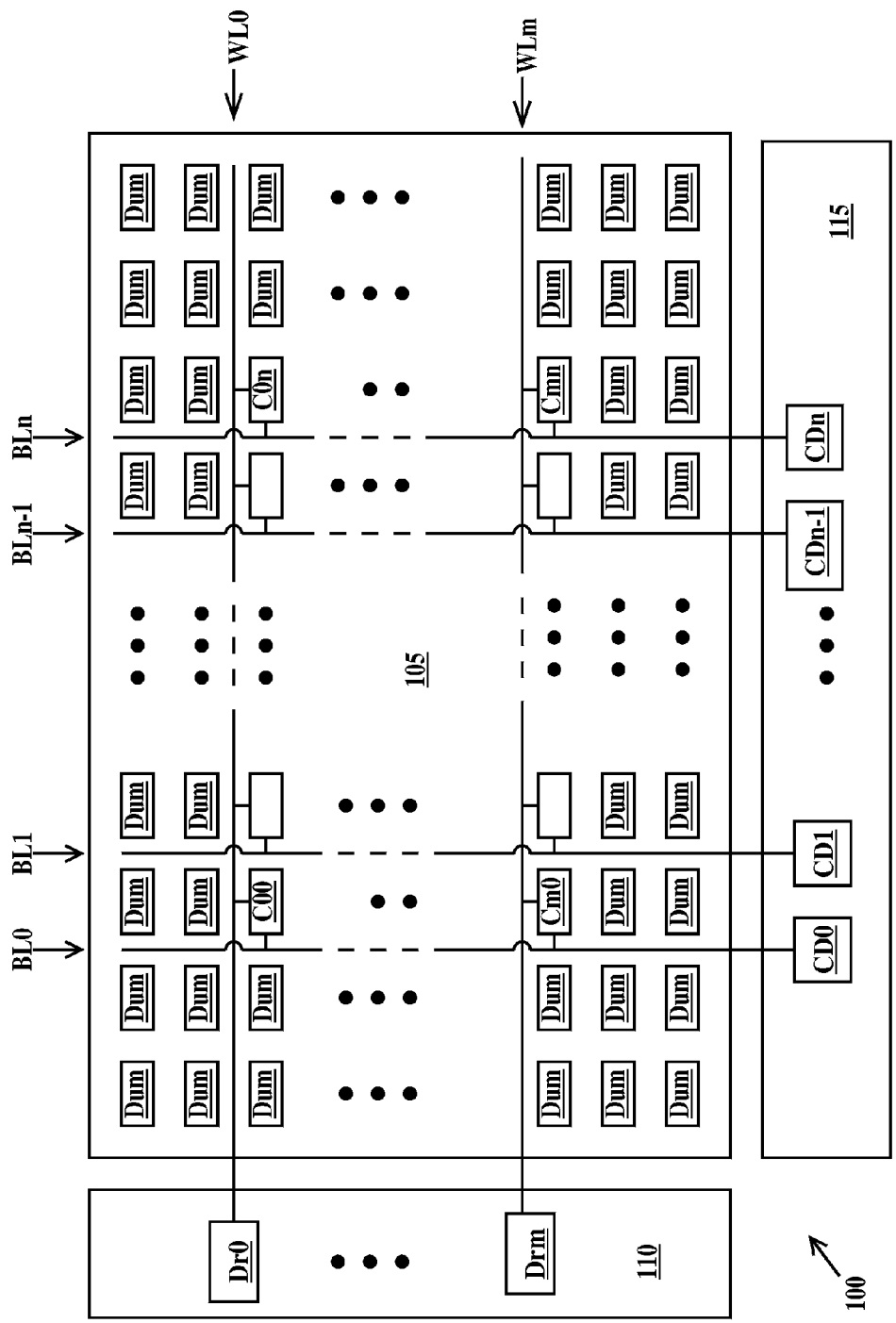
FIG. 2 is schematic diagram of an exemplary base memory block to be modified according to the embodiments of the present invention.

FIG. 2 is schematic diagram of an exemplary base memory block to be modified according to the embodiments of the present invention. In FIG. 2, memory block 100 includes memory cell array 105, wordline driver circuit 110 and bitline decode circuit 115. Memory cell array 105 comprises an m row by n column matrix of primary memory cells Cxy with the cell in the first row and first column designated C00 and the cell in the last row and last column designated Cmn. Adjacent to the first column of primary memory cells C00 to Cm0 are two rows of dummy memory cells Dum. Adjacent to the last column of primary memory cells C0n to Cmn are two rows of dummy memory cells Dum. Adjacent to the first row of primary memory cells C00 to C0n are two rows of dummy memory cells Dum. Adjacent to the last row of primary memory cells Cm0 to Cmn are two rows of dummy memory cells Dum. Additionally in each corner of memory cell array 105 are four dummy memory cells Dum to make memory block 100 a rectangular matrix. Wordline driver circuit 110 includes a set of wordline drivers Dr0 to Drm, there being a corresponding wordline driver for each row of primary memory cells Cxy. Bitline decode circuit 115 includes a set of bitline decoders CD0 to CDn, there being a corresponding bitline decoder for each column of primary memory cells Cxy. Wordline drivers Dr0 though Drm are connected to respective wordlines WL0 through WLm. All primary memory cells Cxy in a particular row of memory block 100 are connected to a same wordline. Bitline decoders CD0 though CDn are connected to respective bitlines BL0 through BLn. All primary memory cells Cxy in a particular column of memory block 100 are connected to a same bitline. In FIG. 2, no dummy memory cells Dum are connected to any wordline or bitline. While two rows and columns of dummy memory cells Dum are illustrated around the periphery of the primary memory cell matrix in FIG. 2 (the dummy memory cells are arranged in two concentric peripheral rings around the primary memory cells), there may be a few as one or more than two rows and columns of dummy memory cells around the periphery of the primary memory cells.

Dummy memory cells Dum are identical to primary memory cells Cxy up to a predetermined fabrication level of an integrated circuit chip containing memory block 100. The predetermined fabrication level may be the last fabrication level of the integrated circuit chip or a fabrication level before the last fabrication level. In one example, fabrication levels correspond to the photomasks of the photolithography processes used to define the geometries of elements of memory block 100. Examples of fabrication/masking levels include, but are not limited to, those defining dielectric isolation in a substrate, P-wells and N-wells in the substrate, source/drains of field effect transistors (FETs) in the substrate, gate dielectrics and gate electrodes of the FETs above the substrate, contacts to the source/drains, gates and N-wells and P-wells through a passivation layer formed on the substrate, a first wiring level in a first interlevel dielectric layer (ILD) formed on the passivation layer, and other wiring levels formed in other ILD layers above the first wiring level. One purpose of dummy memory cells is to prevent photolithographic distortions (e.g., proximity effects) that may occur in primary memory cells Cxy located at the periphery of the array of primary memory cells when very small and closely spaced photoresist images are formed to define the primary memory cells.

For the purposes of describing the present invention, electrically conductive wiring levels will be designated from that level closest to the substrate to that level furthest away as: contact level (CA), first wiring level (M1), second wiring level (M2), third wiring level (M3) though last wiring level (LM) and finally a terminal pad level (TM). TM level provide connection points for structures such as wirebonds or solder bumps that allow power and signal connections off-chip. Thus, a "higher" wiring level is defined as always further away from the substrate than a "lower" wiring layer. Structures such as gate electrodes of field effect transistors and local wordlines (e.g., formed from polysilicon) are located below CA level. Generally there are respective electrically conductive via levels connecting adjacent pairs of M1 through TM levels. Via levels may be separate or integral to the upper wiring level of the adjacent pairs of wiring levels. Vias are designated by the lower wiring level of the adjacent pair. Thus, a via connecting M1 and M2 is a V1 via, a via connecting M2 and M3 is a V2 via, etc. On one examples contacts, wires and vias comprise metals and/or metal nitrides.

Examples of primary memory cells include static random access memory (SRAM) cells and dynamic access memory (DRAM) cells. While memory block 100 of FIG. 2 shows each primary memory cell C connected to a single wordline and a single bitline, depending upon the type of memory block, each memory cell may be connected to more than one wordline and/or more than one bitline. For example, simple SRAM arrays have a single wordline and two bitlines (a bitline true and a bitline not) connected to each SRAM cell. Multi-port SRAM arrays can have multiple "wordlines" and "bitlines" connected to each SRAM cell.

Figure 3:
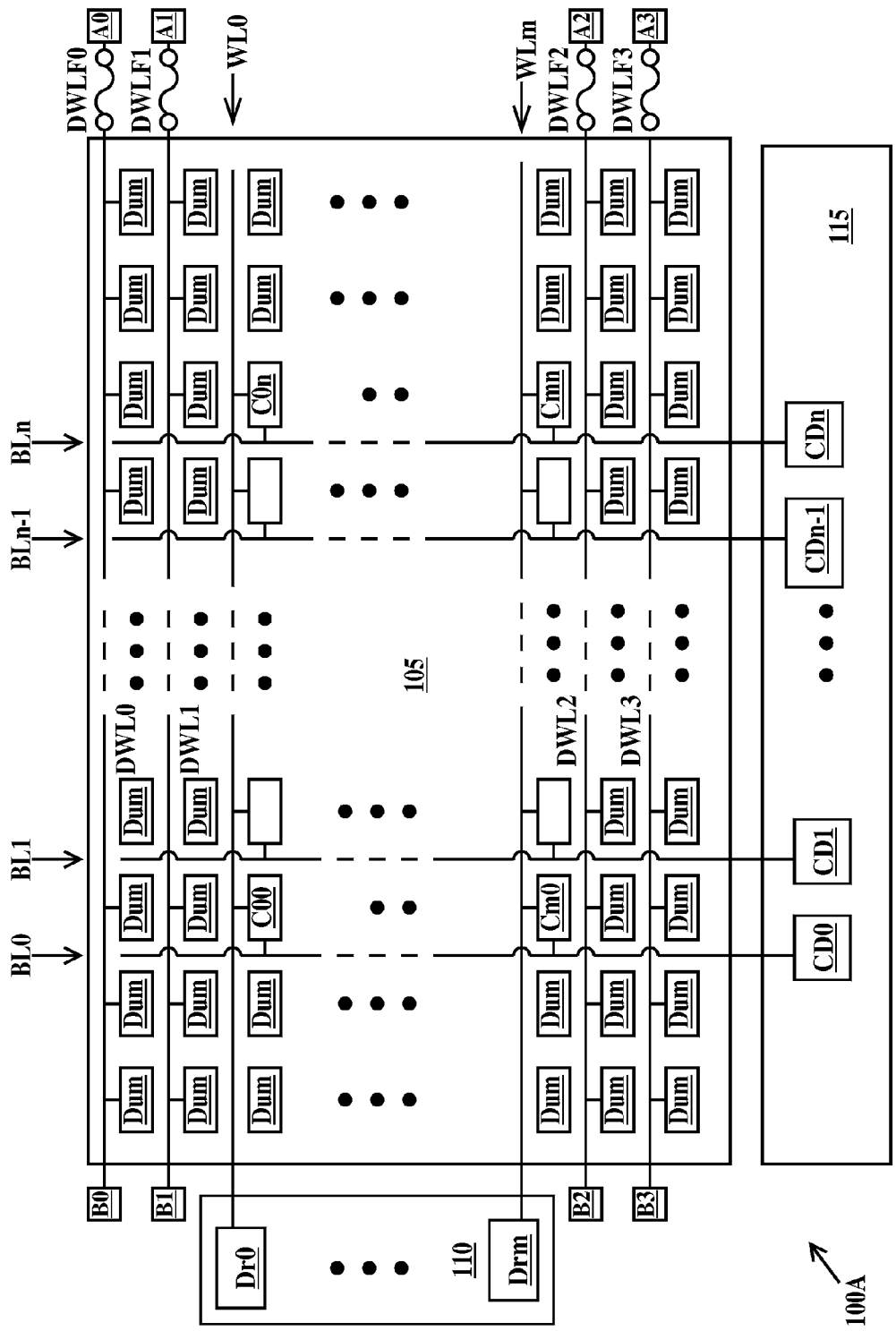
FIG. 3 is a schematic diagram of a first memory block according to embodiments of the present invention.

FIG. 3 is a schematic diagram of a first memory block according to embodiments of the present invention. In FIG. 3 only one block is shown as other blocks would have the same or a similar design. In FIG. 3, a memory block 100A is similar to memory block 100 of FIG. 2 except dummy wordlines DW0 through DW3 are connected respectively to the one of four rows of dummy memory cells Dum. Each dummy wordline DW0 through DW3 is connected between a respective pad sets A0/B0, A1/B1, A2/B2 and A3/B3. Fuses DWLF0 through DWLF3 connected between pads A0 through A3 and dummy wordlines DWL0 through DWL3 are optional. Though not shown in FIG. 3, there may be additional optional fuses between A0 through A3 and dummy wordlines DWL0 through DWL3. One or more additional pads may be connected to each dummy wordline DWL0 through DWL3. In one example, pads A0 through A3 and B0 through B3 are internal pads otherwise used for other purposes by memory block 100A after fabrication of memory block 100A is complete, such as VDD (power) or GND pads. By internal pads, it is meant pads at an intermediate wiring level, such as a M1, M2, etc, but not LM or TM. In an example where both the "A" pad and the "B" pad are the same function pad (such as both are VDD pads or both are GND pads) then when fabrication of memory block 100A is complete, those internal pads can still be used for their normal function of connecting to higher wiring levels. Where connection of the dummy wordlines to internal pads would prevent normal operation of memory block 100A or present a reliability risk, fuses DWLF0 through DWLF3 may be "blown" to disconnect the dummy wordlines from the internal pads.

By appropriate electrical probing of pads A0/B0 through A3/B3, before further fabrication of memory block 100A, various open failure, short failure or leakage current failure tests can be performed. Dummy memory cells Dum serve a dual role of providing test structures as well as a proximity correction. Thus, many dedicated test structures can be eliminated saving integrated circuit chip real estate or increased test coverage can be provided without increasing the area of the integrated circuit chip. It is advantageous that pads A0 through A3 and B0 through B3 be normally fabricated pads of memory block 100A and not specially added to allow testing of the dummy cells of memory block 100A.

An advantage of connecting each of the dummy wordlines to its own pad or pair of pads as shown in FIG. 3 is to identify where the failure is within the memory block, which can provide further insights about the failure mechanism. However this can require a large number of internal pads with large memory arrays. Alternatively, the number of internal pads required may be reduced by connecting dummy wordlines of different groups of memory blocks to respective sets of single internal pads or to respective sets of pairs of internal pads the memory array. Alternatively the number of internal pads required may be further reduced by connecting all dummy wordlines of all memory blocks to a single internal pad or to a single pair of internal pads of the memory array. Both of these alternatives have the advantages of saving the number of internal pads needed (available internal pads are often limited because they take up chip real estate) as well as speeding up the tests so that all dummy cells can be tested one time.

It should be understood that not all memory blocks of a memory array are required to practice the embodiments of the present invention and that a selected set of memory blocks may be used.

It should also be pointed out that the layout of the dummy cells may be modified as needed to detect certain defect or systematic failure mechanism. For example, polysilicon gates in dummy cells may not normally be connected together. In order to test polysilicon gate open or polysilicon gate short failure mechanisms, polysilicon gates in dummy cells in the same rows can be connected together. However, the layout of the dummy cells should not be modified so dramatically that the dummy cells no longer function for proximity correction. A check of whether a modification of the dummy cell layout has effected proximity correction can be verified by lithographic simulation during the design stage of the integrated circuit chip.

Figure 4A:
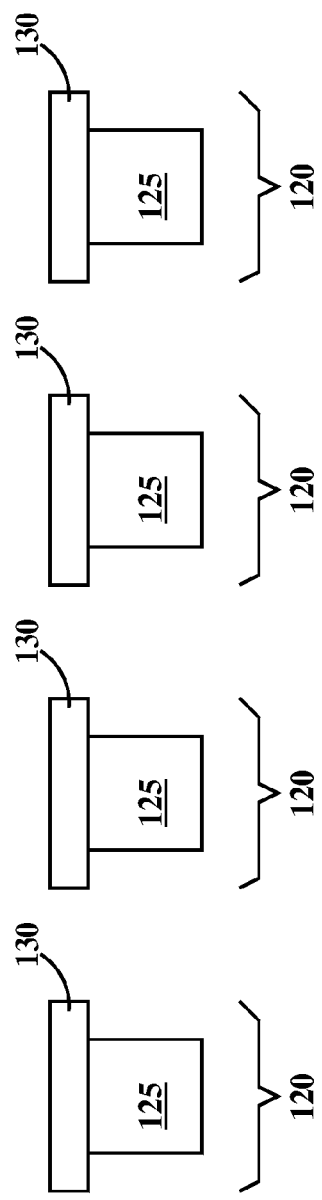
FIGS. 4A and 4B are cross-sectional views illustrating how to form an exemplary test structure in the memory array of FIG. 3.
Figure 4B:
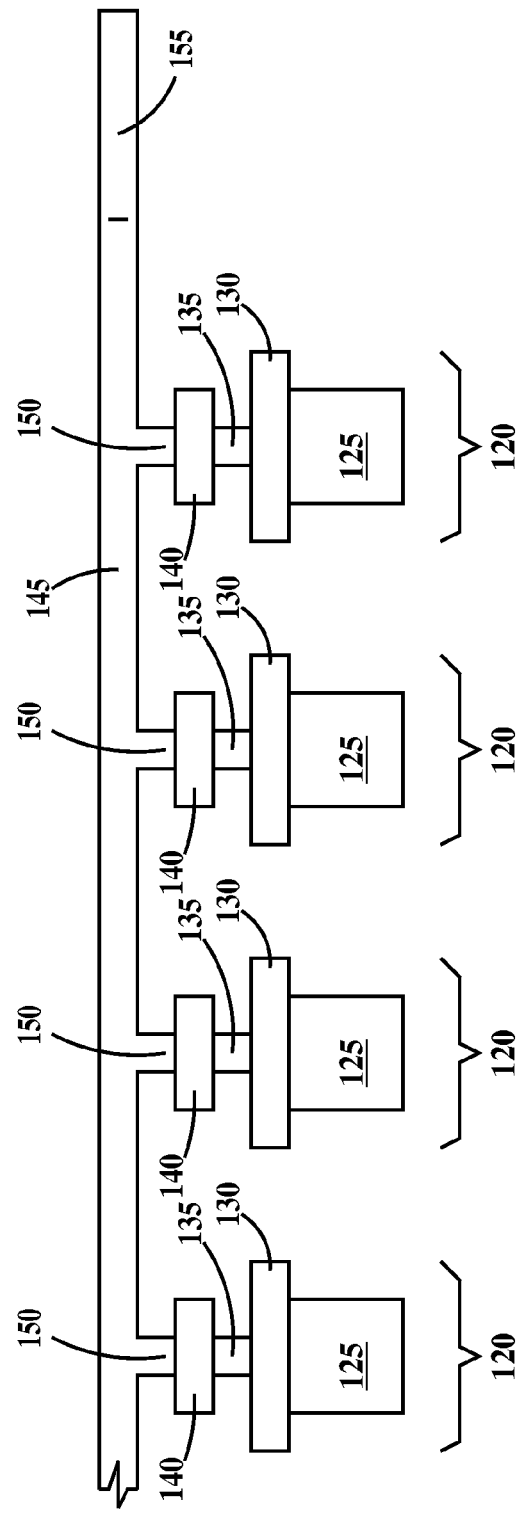

FIGS. 4A and 4B are cross-sectional view illustrating how to form an exemplary test structure in the memory block of FIG. 3. In one example, wordlines are formed of local wordlines integrally formed with polysilicon gates of FETs, which are connected by wires in second or third wiring levels into global wordlines. In FIG. 4A, dummy memory cells 120 include a substrate portion and a polysilicon portion 130. As described supra, silicon portion 125 may include the source/drains of FETs and polysilicon portion 130 may include gate electrodes of the FETs and local wordlines. In FIG. 4B, CA contacts 135, M1 wires 140 and a M2 dummy wordline 145 have been added to the structures illustrated in FIG. 4A. Wordline 145 includes integral vias 150 electrically connecting M1 wires to an internal pad 155. Because of the complexity of memory cells such a SRAM cells there exist many different possible connections points between dummy wordline 145 and dummy memory cells 120. In variations of FIGS. 4A and 4B, some or all of contacts 135 and/or wires 140 may be part of dummy cells 120. Alternatively, dummy wordline 145 may be formed in an M1 wiring level or an M3 wiring level. Alternatively, dummy wordline 145 may be formed as part of dummy cells 120, but not connected to internal pad 155, in which case only the connection between dummy wordline 145 and internal pad 155 must be made.

Figure 5:
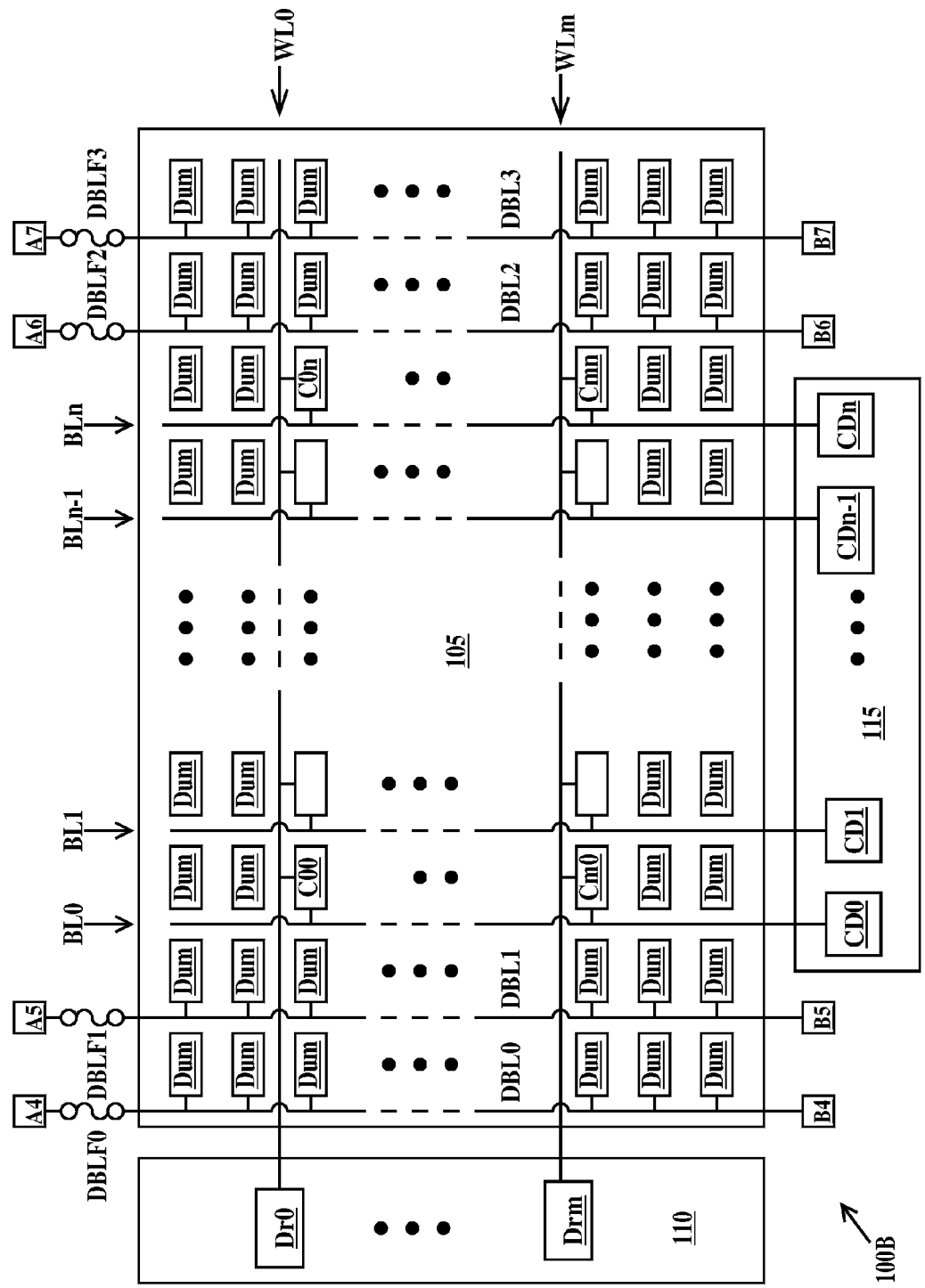
FIG. 5 is a schematic diagram of a second memory block according to embodiments of the present invention.

FIG. 5 is a schematic diagram of a second memory block according to embodiments of the present invention. In FIG. 5, a memory block 100B is similar to memory block 100 of FIG. 2 except dummy bitlines BDL0 through DBL3 are connected respectively to the one of four columns of dummy memory cells Dum. Each dummy bitline DBL0 through DBL3 is connected between a respective pad set A4/B4, A5/B5, A6/B6 and A7/B7. Fuses DBLF0 through DBLF3 are connected between pads A4 through A7. Though not shown in FIG. 5, there may be additional optional fuses between pads A4 through A7 and dummy bitlines DBL0 through DBL3. One or more additional pads may be connected to each dummy bitline DBL0 through DBL3. In one example, pads A4 through A7 and B4 through B7 are internal pads otherwise used for other purposes by memory block 100B when fabrication of memory block 100B is complete, such as VDD (power) or GND pads. In an example where both the "A" pad and the "B" pad are the same function pad (such as both are VDD pads or both are GND pads) then when fabrication of memory block 100B is complete, those internal pads can still be used for their normal function of connecting to higher wiring levels. Where connection of the dummy bitlines to internal pads would prevent normal operation of memory block 100B or present a reliability risk, fuses DBLF0 through DBLF3 may be "blown" to disconnect the dummy bitlines from the internal pads.

By appropriate electrical probing of pads A4/B4 through A7/B7, before further fabrication of memory block 100B, various open failure, short failure or leakage current failure tests can be performed. As described supra, the dummy memory cells now serve a dual role of providing test structures as well as a proximity correction. Thus, separate test structures can be eliminated saving integrated circuit chip real estate or increased test coverage can be provided without increasing the area of the integrated circuit chip. It is advantageous that pads A4 through A7 and B4 through B7 be normally fabricated pads of memory block 100B and not specially added to allow testing of the dummy cells of memory block 100B.

An advantage of connecting each of the dummy bitlines to its own pad or pair of pads as shown in FIG. 5 is to identify where the failure is within the memory block, which can provide further insights about the failure mechanism. However this can require a large number of internal pads with large memory arrays. Alternatively, the number of internal pads required may be reduced by connecting dummy bitlines of different groups of memory blocks to respective sets of single internal pads or to respective sets of pairs of internal pads the memory array. Alternatively the number of internal pads required may be further reduced by connecting all dummy bitlines of all memory blocks to a single internal pad or to a single pair of internal pads of the memory array. Both of these alternatives have the advantages of saving the number of internal pads needed (available internal pads are often limited because they take up chip real estate) as well as speeding up the tests so that all dummy cells can be tested one time.

Figure 6A:
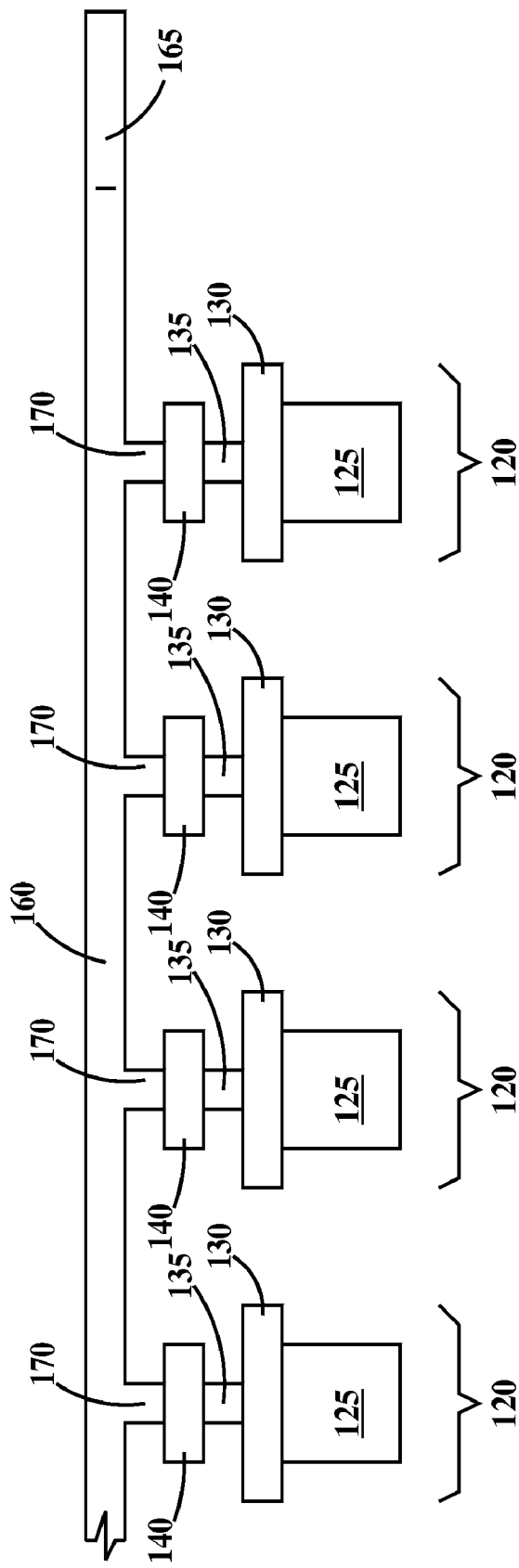
FIGS. 6A and 6B are cross-sectional views illustrating exemplary test structures that may be embedded in the memory block of FIG. 5.
Figure 6B:
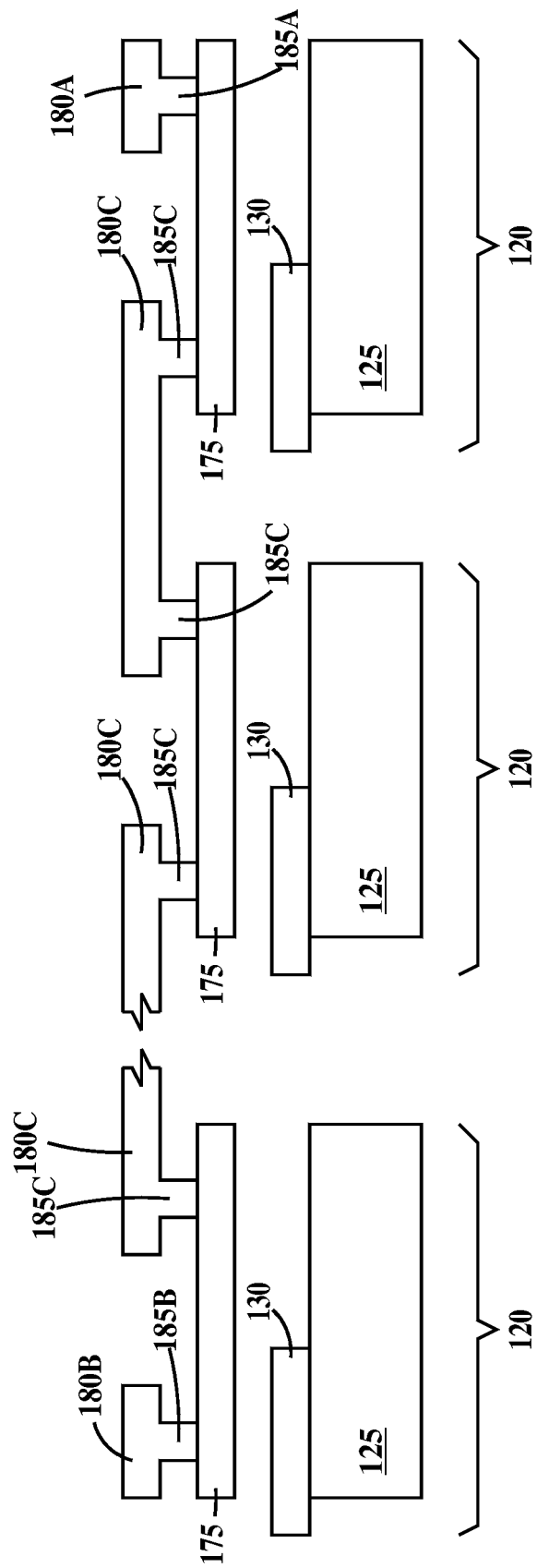

FIGS. 6A and 6B are cross-sectional view illustrating exemplary test structures that may be embedded in the memory block of FIG. 5. FIG. 6A is similar to FIG. 4A except dummy wordline 145 and pad 155 of FIG. 4A are replaced with dummy bitline 160 connecting dummy cells 120 to pad 165 by vias 170. Alternatively, dummy bitline 160 may be formed as part of dummy cells 120, but not connected to internal pad 165, in which case only the connection between dummy bitline 160 and internal pad 165 must be made.

In FIG. 6B, the dummy test cells are used to construct a via chain test structure. A via chain comprises a set of serially connected vias. In FIG. 6B, either the normal M1 wires of dummy cells 130 or specially designed M1 wires are used as wire segments 175. Pads 180A and 180B and wire segments 175 are formed in M2. An integral via 185A connects a wire segment 175 to pad 180A. An integral via 185B connects a wire segment 175 to pad 180B. Integral vias 185C connect wire segments into a via chain. In FIG. 6B, current passing from pad 180A to pad 180B must pass through all vias 185C, thus the term via chain.

It should be understood, that the features of memory block 100A and memory block 100B may be combined into a single array having dummy wordlines and dummy bitlines electrically testable using corresponding internal pads as described supra.

Figure 7:
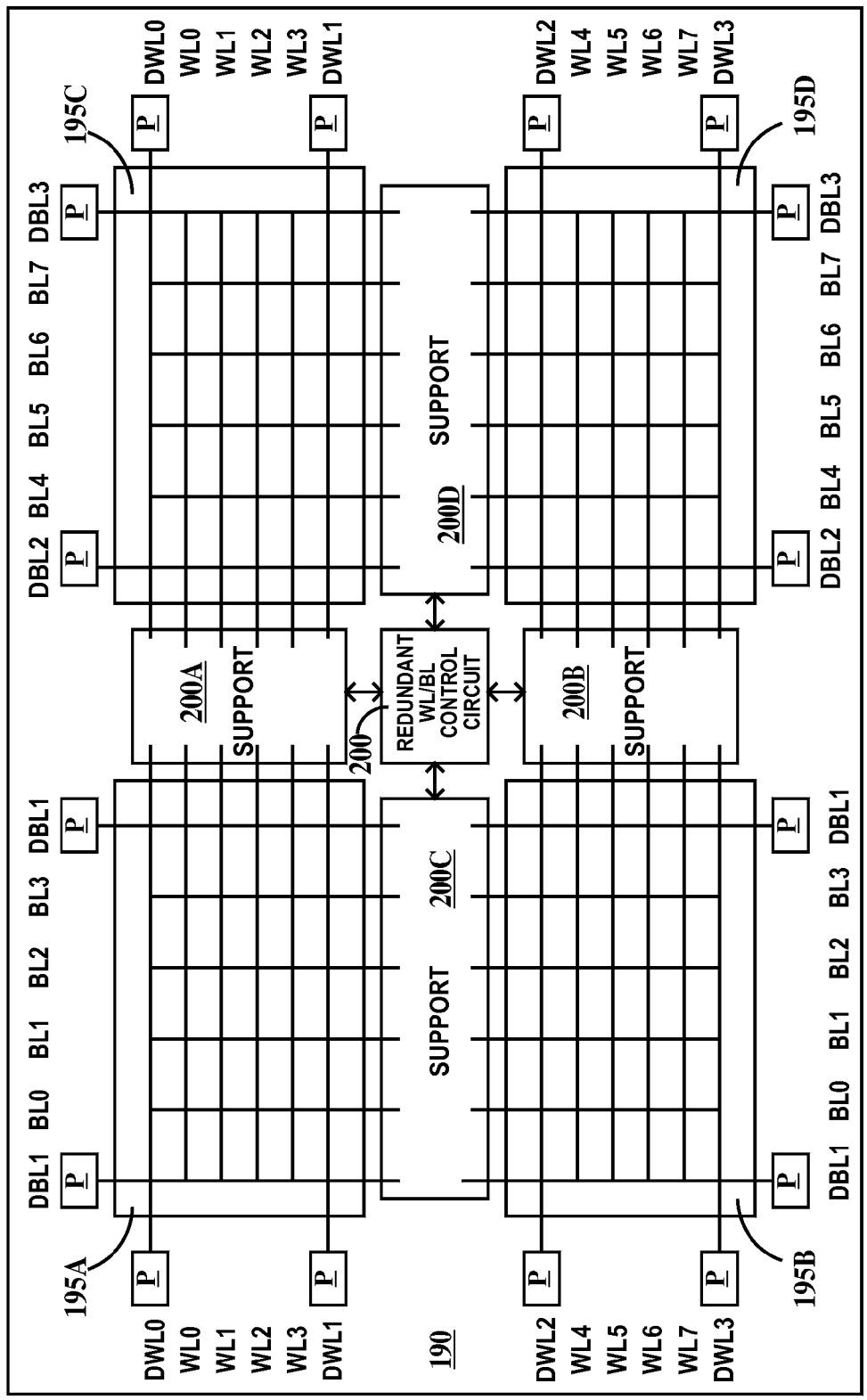
FIG. 7 is a diagram of an exemplary memory array according to embodiments of the present invention.

FIG. 7 is a diagram of an exemplary memory array according to embodiments of the present invention. In FIG. 7, a memory array 190 includes memory blocks 195A, 195B, 195C and 195D and support circuits 200A, 200B, 200C and 200D. Support circuits 200A, 200B, 200C and 200D are connected to a redundant wordline/bitline control circuit 200E. Memory block 195A includes dummy wordlines DWL0 and DWL1, wordlines WL0 through WL3, dummy bitlines DBL0 and DBL1 and bitlines BL0 through BL3. Dummy wordlines DWL0 and DWL1 and dummy bitlines DBL0 and DBL1 connect to dummy memory cells (not shown) in the periphery of memory block 195A around the primary memory cells (not shown) and terminate in internal pads P. WL0 through WL3 and bitlines BL0 through BL3 are connected to primary memory cells (not shown). Wordlines WL1 through WL3 are driven by support circuits 200A. Bitlines BL0 through BL3 are decoded by support circuits 200C.

Memory block 195B includes dummy wordlines DWL2 and DWL3, wordlines WL4 through WL7, dummy bitlines DBL0 and DBL1 and bitlines BL0 through BL3. Dummy wordlines DWL0 and DWL1 and dummy bitlines DBL0 and DBL1 connect to dummy memory cells (not shown) in the periphery of memory block 195B around the primary memory cells (not shown) and terminate in internal pads P. WL4 through WL7 and bitlines BL0 through BL3 are connected to primary memory cells (not shown). Wordlines WL4 through WL7 are driven by support circuits 200B. Bitlines BL0 through BL3 are decoded by support circuits 200C.

Memory block 195C includes dummy wordlines DWL0 and DWL1, wordlines WL0 through WL3, dummy bitlines DBL2 and DBL3 and bitlines BL4 through BL7. Dummy wordlines DWL0 and DWL1 and dummy bitlines DBL2 and DBL3 connect to dummy memory cells (not shown) in the periphery of memory block 195C around the primary memory cells (not shown) and terminate in internal pads P. WL0 through WL2 and bitlines BL4 through BL7 are connected to primary memory cells (not shown). Wordlines WL0 through WL3 are driven by support circuits 200A. Bitlines BL4 through BL7 are decoded by support circuits 200D.

Memory block 195D includes dummy wordlines DWL2 and DWL3, wordlines WL4 through WL7, dummy bitlines DBL2 and DBL3 and bitlines BL4 through BL7. Dummy wordlines DWL2 and DWL3 and dummy bitlines DBL2 and DBL3 connect to dummy memory cells (not shown) in the periphery of memory block 195D around the primary memory cells (not shown) and terminate in internal pads P. WL4 through WL7 and bitlines BL4 through BL7 are connected to primary memory cells (not shown). Wordlines WL4 through WL7 are driven by support circuits 200B. Bitlines BL4 through BL7 are decoded by support circuits 200D.

Redundant wordline/bitline control circuit 200E directs data from known defective wordlines and bitlines to known good dummy wordlines and bitlines. In one example, redundant wordline/bitline control circuit 200E replaces addressing information of know defective wordlines and bitlines with addressing information of known good dummy wordlines or bitlines. Thus, exclusive use redundant wordlines and bitlines can be eliminated saving integrated circuit chip real estate or increased redundancy can be provided without increasing the area of the integrated circuit chip.

Figures 8A, 8B, 8C:
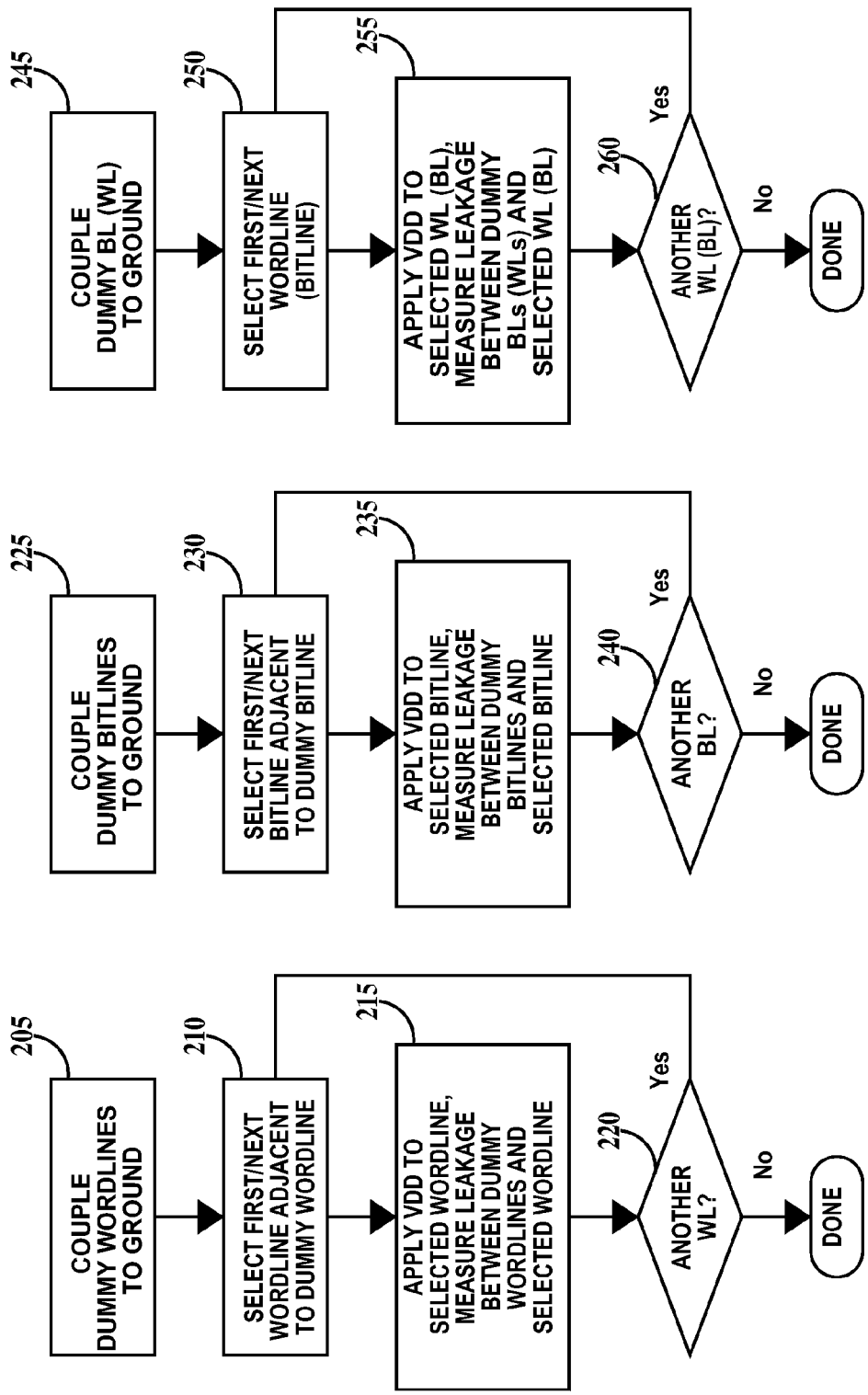
FIGS. 8A, 8B and 8C are flowcharts illustrating methods of testing the memory block of FIG. 7 according to embodiments of the present invention.

FIGS. 8A, 8B and 8C are flowcharts illustrating methods of testing the memory block of FIG. 7 according to embodiments of the present invention to allow more precise localization of failures. Turning to FIG. 8A, in step 205, all the dummy wordlines are coupled to ground. These are dummy wordlines DWL0 through DWL3 of FIG. 7. In step 210, the first/next wordline adjacent to a dummy wordline is selected. This is wordline WL0 of FIG. 7. In step 215, VDD is applied to the selected wordline and leakage current measured between the dummy wordlines and the selected wordline. In step 220, it is determined if there is another wordline adjacent to a dummy wordline. If there is another wordline adjacent to a dummy wordline, then the method loops back to step 210 as the next adjacent wordline is be wordline WL3 (see FIG. 7). Steps 210 through 215 repeat until there are no longer any other wordlines adjacent to a dummy wordline (this is wordline WL7 of FIG. 7).

Turning to FIG. 8B, in step 225, all the dummy bitlines are coupled to ground. These are dummy bitlines DBL0 through DBL3 of FIG. 7. In step 230, the first/next bitline adjacent to a dummy bitline is selected. This is bitline BL0 of FIG. 7. In step 255, VDD is applied to the selected wordline and leakage current measured between the dummy bitlines and the selected wordline. In step 240, it is determined if there is another bitline adjacent to a dummy bitline. If there is another bitline adjacent to a dummy bitline, then the method loops back to step 230 as the next adjacent bitline is bitline BL3 (see FIG. 7). Steps 230 through 235 repeat until there are no longer any other bitlines adjacent to a dummy bitline (this is bitline BL7 of FIG. 7).

Turning to FIG. 8C, in step 245, all the dummy bitlines are coupled to ground. These are dummy bitlines DBL0 through DBL3 of FIG. 7. In step 250, the first/next wordline is selected. This is wordline WL0 of FIG. 7. In step 255, VDD is applied to the selected wordline and leakage current measured between the dummy bitlines and the selected wordline. In step 260, it is determined if there is another wordline. If there is another wordline, then the method loops back to step 250 as the next wordline is wordline WL1 (see FIG. 7). Steps 250 through 260 repeat until there are no longer any other wordlines to select (the last wordline is wordline WL7 FIG. 7).

In the alternative of FIG. 8C, in step 245, all the dummy wordlines are coupled to ground. These are dummy wordlines DWL0 through DWL3 of FIG. 7. In step 250, the first/next bitline is selected. This is bitline BL0 of FIG. 7. In step 255, VDD is applied to the selected bitline and leakage current measured between the dummy wordlines and the selected bitline. In step 260, it is determined if there is another bitline. If there is another bitline, then the method loops back to step 250 as the next bitline is bitline BL1 (see FIG. 7). Steps 250 through 260 repeat until there are no longer any other bitlines to select (the last bitline is bitline BL7 of FIG. 7).

The methods described in FIGS. 8A, 8B and 8B allow more precise physical location of defects causing short or leakage fails as an aid to physical failure analysis. The tests of FIGS. 8A, 8B, and 8C may be performed in any order and in any combination.

It should be understood that alternative versions of memory block 190 of FIG. 7, may include dummy bitlines but not dummy wordlines or include dummy wordlines but not dummy bitlines, in both cases including all the peripheral dummy memory cells. In which case, corresponding test methods illustrated in FIGS. 8A, 8B and 8C would not be performable.

Figure 9:
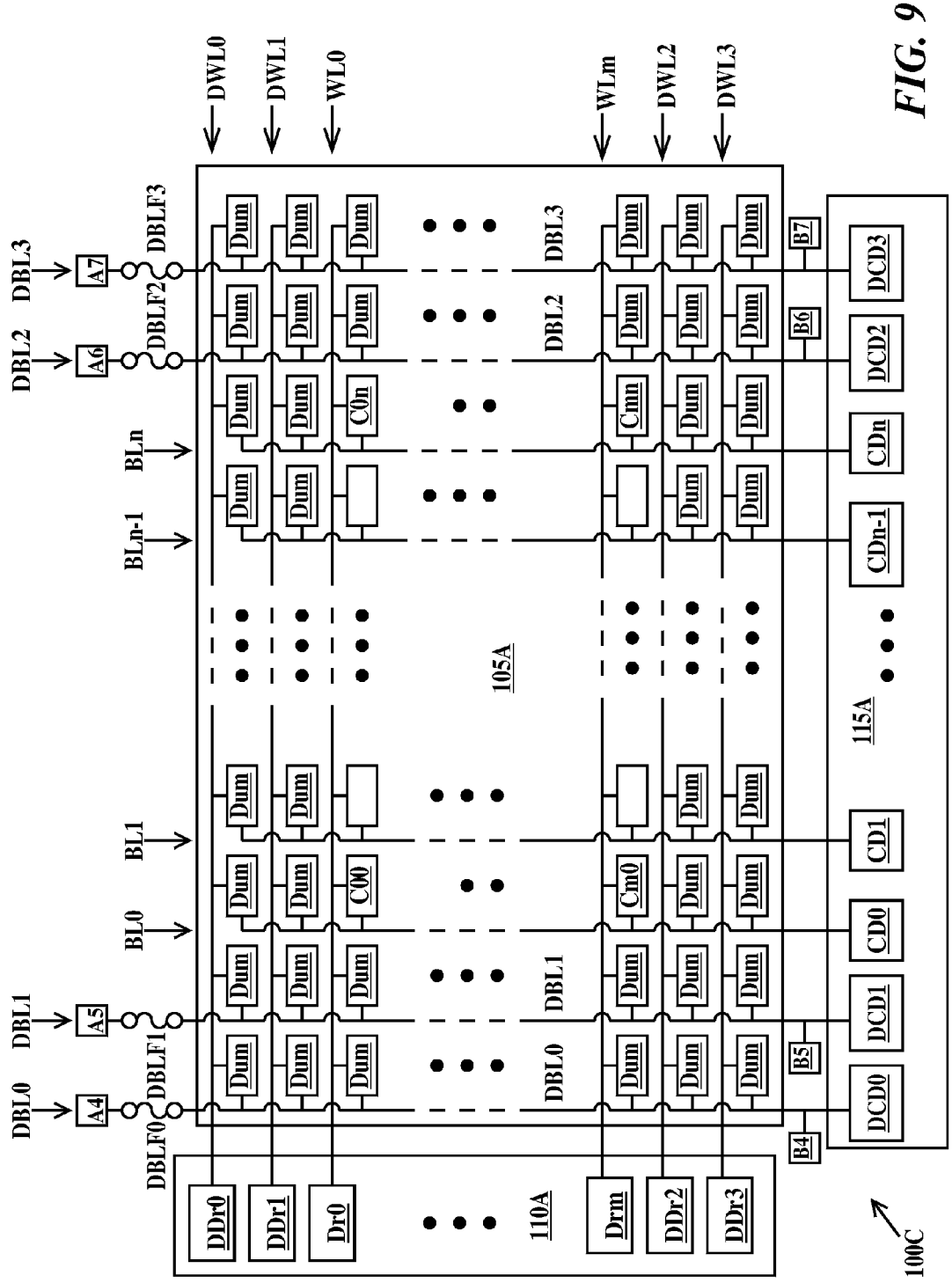
FIG. 9 is a schematic diagram of a third memory block according embodiments of the present invention.

FIG. 9 is a schematic diagram of a third memory block according embodiments of the present invention. In FIG. 9, a memory block 100C is similar to memory block 110B of FIG. 5, except, dummy cell decoders DCD0 through DCD3 have been added and connected to respective dummy bitlines DLB0 and DBL3, and dummy wordline drivers DDr0 through DDr3 have been added and connected to added and respective dummy wordlines DWL0 through DWL3. The restrictions on dummy bitlines DBL0 through DBL3, dummy wordlines DWL0 through DWL3 and all dummy memory cells Dum is that they be capable of functioning in a manner similar to normal wordlines and bitlines and primary memory cells Cxy. The restrictions on dummy wordline drivers DDr0 through DDr3 and dummy cell decoders DCD0 through DCD3 include that they be addressable as redundant wordlines and bitlines. Redundant wordlines and bitlines are wordlines and bitlines that permanently replace failed wordlines and bitlines, usually using a fusing technique. Dummy wordlines DWL0 through DWL3 and dummy bitlines DBL0 through DBL3 are distinguishable by there connection to internal pads A4 through A7 and B4 through B7 and fuses DBLF0 through DBLF3, if present.

It should be understood that method described in FIG. 9, of wiring of dummy memory cells to dummy bitlines and dummy wordlines and the use of dummy wordlines and bitlines as redundant wordlines and bitlines is applicable to memory block 110A of FIG. 3 or a memory block that is a combination of memory block 100A and memory block 100B of FIG. 5.

Thus the embodiments of the present invention provide the semiconductor industry with techniques to reduce integrated circuit chip size without compromising yield and reliability.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method comprising:
   fabricating a memory array comprising one or more memory blocks, each memory block of said one or more memory blocks comprising memory cells arranged in rows and columns;
   for each memory block of said one or more memory blocks, designating memory cells in one or more adjacent rings of memory cells nearest a perimeter of said memory block as dummy memory cells;
   selecting a set of one to all of said one or more memory blocks to create a set of selected memory blocks;
   for each memory block of said set of selected memory blocks and before a final fabrication level of said memory array, electrically connecting dummy memory cells of selected rows together, electrically connecting dummy memory cells of selected columns together or both electrically connecting dummy memory cells of selected rows together and electrically connecting dummy memory cells of selected columns together;
   for each memory block of said of said set of selected memory blocks and before said final fabrication level, testing said selected rows, selected columns or selected rows and columns of dummy memory cells of said;
   for each memory block of said of said set of selected memory blocks and after said testing, completing fabrication of said memory block to said final fabrication level;
   for each memory block of said of said set of selected memory blocks, connecting said dummy cells at opposite ends of said selected rows of dummy memory cells to normally fabricated first pads of said memory array;
   for each memory block of said set of selected memory blocks, connecting dummy cells at opposites ends of said selected columns of dummy memory cells to normally fabricated second pads of said memory array of said memory array;
   forming a fuse between one or more of said first pads and said selected rows of dummy memory cells;
   forming a fuse between one or more of said second pads and said selected rows of dummy memory cells;
   for each memory block of said one or more memory blocks, except for dummy memory cells, electrically connecting each memory cell in each row of said memory array to a respective wordline and each wordline to a respective wordline driver;
   for each memory block of said one or more memory blocks except for dummy memory cells, electrically connecting each memory cell in each column of said memory array to a respective bitline and each bitline to a respective bitline decoder;
   wherein said selected rows, selected columns or selected rows and columns of dummy memory cells are rows, columns or rows and columns along said perimeter of said memory blocks of said set of selected memory blocks; and
   wherein said memory cells are selected from the group consisting of static random access memory cells and dynamic access memory cells.

2. A method comprising:
   fabricating a memory array comprising an array of one or more memory blocks, each memory block of said one or more memory blocks comprising an array of memory cells arranged in rows and columns;
   for each memory block of said one or more memory blocks, designating memory cells in one or more adjacent rings of memory cells nearest a perimeter of said memory block as dummy memory cells;
   selecting a set of one to all of said one or more memory blocks to create a set of selected memory blocks;
   for each memory block of said one or more memory blocks, except for dummy memory cells, electrically connecting each memory cell in each row to a respective wordline and each wordline to a respective wordline driver;
   for each memory block of said one or more memory blocks, except for dummy memory cells, electrically connecting each memory cell in each column to a respective bitline and each bitline to a respective bitline decoder;

for each memory block of said set of selected memory blocks, electrically connecting a selected row or column of said dummy memory cells together and to selected pads of said memory array;

applying a voltage at a first level to said selected pads;

for each memory block of said one or more memory blocks, selecting a wordline or bitline that is adjacent to said selected row or column and applying a voltage at a second level to said selected wordline or bitline, said first level different from said second level;

for each memory block of said set of selected memory blocks, measuring any current flow between said selected pads and said selected wordline or bitline;

connecting said selected pads to a terminal ground pad or a terminal power pad of an integrated circuit chip containing said memory array;

for each memory block of said set of selected memory blocks, (i) forming a fuse between one or more of said first pads and said selected row of dummy memory cells; or (ii) forming a fuse between one or more of said second pads and said selected row of dummy memory cells; and wherein said memory cells are selected from the group consisting of static random access memory cells and dynamic access memory cells.

3. A memory array comprising:

an array of one or more memory blocks, each memory block comprising an array of memory cells arranged in rows and columns, memory cells in one or more adjacent rings of memory cells nearest a perimeter of each memory block of said one or more memory blocks designated as dummy memory cells;

for at least one of said one or more memory blocks, dummy memory cells in a row or column electrically connected together into a dummy row or dummy column, a first end of said dummy row or dummy column connected to a first pad of said memory array;

for each memory block of said one or more memory blocks, except for dummy memory cells, memory cells in each row connected to a respective wordline and each wordline connected to a respective wordline driver;

for each memory block of said one or more memory blocks, except for dummy memory cells, memory cells in each column of said memory array connected to a respective bitline and each bitline connected to a respective bitline decoder;

a second end of said dummy row or dummy column connected to a second pad of said memory array;

a fuse between said row or column of said dummy memory cells and said first pad; for each memory block of said one or more memory blocks, all dummy memory cells in each row of dummy memory cells connected to respective dummy wordlines and each dummy wordline of said dummy wordlines connected to a respective dummy wordline driver;

for each memory block of said one or more memory blocks, all dummy memory cells in each column of dummy memory cells connected to respective dummy bitlines and each dummy bitline of said dummy bitlines connected to a respective dummy bitline decoder;

for each memory block of said one or more memory blocks, all dummy wordline drivers and all dummy bitline decoders connected to a redundant wordline/bitline control circuit;

wherein said first and second pads are both connected to terminal ground pads or both connected to terminal power pads of an integrated circuit chip containing said memory array; and wherein said memory cells are selected from the group consisting of static random access memory cells and dynamic access memory cells.

* * * * *